United States Patent
Hill et al.

(10) Patent No.: US 9,779,988 B2
(45) Date of Patent: Oct. 3, 2017

(54) SEMICONDUCTOR DEVICES WITH INNER VIA

(71) Applicants: Darrell G. Hill, Tempe, AZ (US); Marcel N. Tutt, Scottsdale, AZ (US)

(72) Inventors: Darrell G. Hill, Tempe, AZ (US); Marcel N. Tutt, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 545 days.

(21) Appl. No.: 14/136,275

(22) Filed: Dec. 20, 2013

(65) Prior Publication Data

US 2015/0179566 A1  Jun. 25, 2015

(51) Int. Cl.

| | |
|---|---|
| H01L 21/768 | (2006.01) |
| H01L 23/522 | (2006.01) |
| H01L 23/48 | (2006.01) |
| H01L 23/482 | (2006.01) |
| H01L 29/417 | (2006.01) |
| H01L 29/423 | (2006.01) |
| H01L 29/735 | (2006.01) |
| H01L 29/778 | (2006.01) |
| H01L 29/20 | (2006.01) |
| H01L 29/16 | (2006.01) |
| H01L 29/78 | (2006.01) |

(52) U.S. Cl.
CPC ...... *H01L 21/76879* (2013.01); *H01L 23/481* (2013.01); *H01L 23/4824* (2013.01); *H01L 29/4175* (2013.01); *H01L 29/41708* (2013.01); *H01L 29/42304* (2013.01); *H01L 29/735* (2013.01); *H01L 29/7786* (2013.01); *H01L 29/1608* (2013.01); *H01L 29/2003* (2013.01); *H01L 29/41758* (2013.01); *H01L 29/7816* (2013.01); *H01L 2924/0002* (2013.01)

(58) Field of Classification Search
CPC ........... H01L 29/2003; H01L 29/66462; H01L 29/7787; H01L 29/205
USPC ..... 257/76, E21.403, E21.407; 438/167, 172
See application file for complete search history.

(56) References Cited

U.S. PATENT DOCUMENTS 7,253,486 B2    8/2007  Green et al.
2009/0001478 A1*  1/2009  Okamoto .......... H01L 21/76898
                                                         257/382

(Continued)

OTHER PUBLICATIONS

Bruce Green et al., "Gallium Nitride RF Technology Advances and Applications", Aug. 2013, 7 pages, Freescale Semiconductor, Inc.

(Continued)

*Primary Examiner* — Jonathan Han

(57) ABSTRACT

A semiconductor device includes a semiconductor substrate having an inactive area and a pair of active areas separated by the inactive area, a control terminal supported by the semiconductor substrate and extending across the pair of active areas and the inactive area to define a conduction path during operation between a first conduction region in each active area and a second conduction region in each active area, a conduction terminal supported by the semiconductor substrate and extending across the pair of active areas and the inactive area for electrical connection to each first conduction region, and a via extending through the semiconductor substrate, electrically connected to the conduction terminal, and positioned in the inactive area.

20 Claims, 4 Drawing Sheets

(56) References Cited

U.S. PATENT DOCUMENTS

| | | | | |
|---|---|---|---|---|
| 2009/0166677 A1* | 7/2009 | Shibata | ............. | H01L 21/76251 257/192 |
| 2013/0043484 A1* | 2/2013 | Curatola | ............... | H01L 29/205 257/76 |
| 2013/0146946 A1* | 6/2013 | Tsurumi | .............. | H01L 29/4175 257/192 |
| 2013/0288401 A1* | 10/2013 | Matsuura | ................ | H01L 22/10 438/14 |
| 2014/0077268 A1* | 3/2014 | Darwish | ............... | H01L 29/737 257/197 |

OTHER PUBLICATIONS

Wendell M. T. Kong et al., "Very High Efficiency V-Band Power InP HEMT MMICs", Nov. 2000, pp. 521-523, vol. 21, No. 11, IEEE Electron Device Letters.

\* cited by examiner

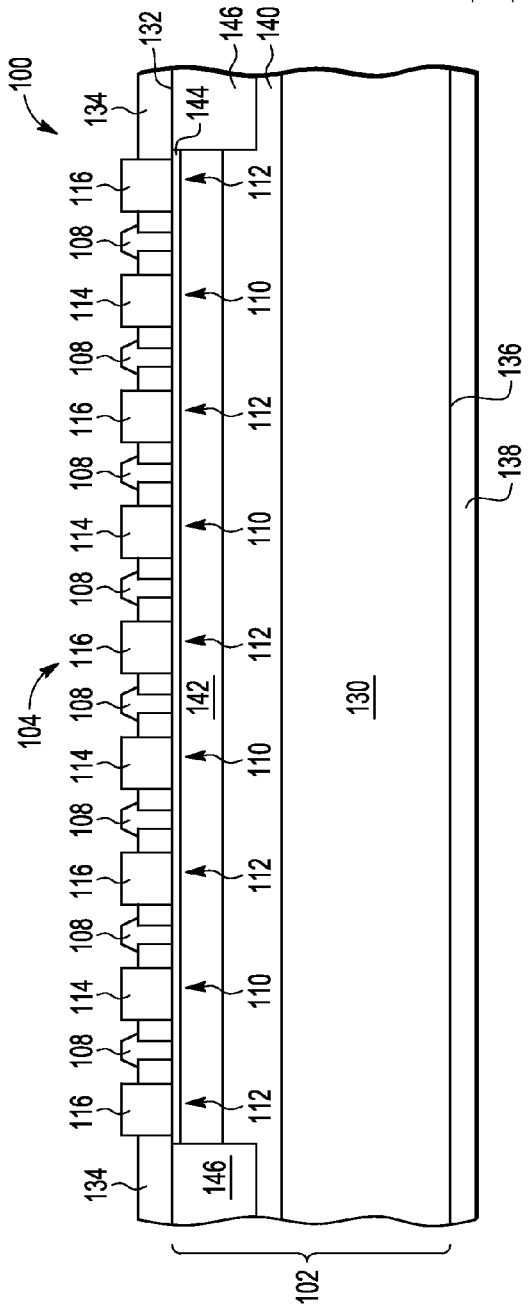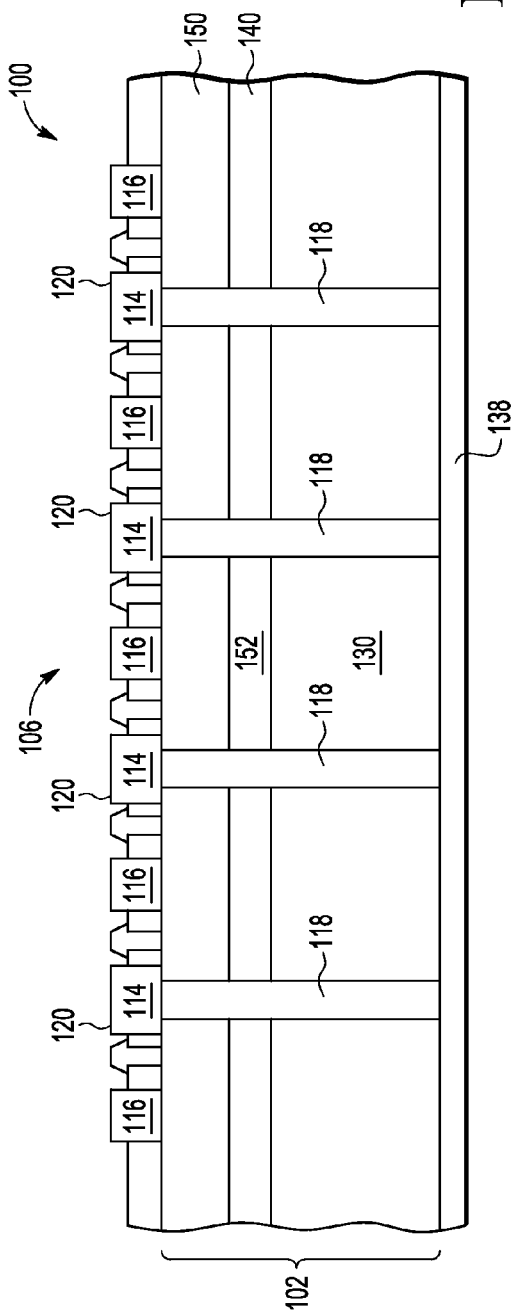

SEMICONDUCTOR DEVICES WITH INNER VIA

FIELD OF INVENTION

The present embodiments relate to semiconductor devices.

BACKGROUND

Gallium nitride (GaN) high electron mobility transistor (HEMT) devices have high breakdown voltages and high cutoff frequencies. GaN field effect transistor (FET) devices have been accordingly useful in high power and high efficiency amplifiers and other devices for high frequency communications and other high frequency applications. HEMT devices are also known as heterojunction field effect transistor (HFET) devices in reference to the derivation of a transistor from a heterostructure.

The use of HFET devices in high frequency applications places an emphasis on the quality of the ground connection. HFET devices are often designed to minimize the resistance and inductance of the ground connection. A typical ground connection in HFET devices is accordingly not made through wire bonds or other high inductance connections. Through-wafer vias are instead commonly used to connect terminals (e.g., source terminals) of an HFET device to ground.

The layout of radio frequency (RF) power FET devices often presents a tradeoff between RF performance, thermal resistance, and cost (e.g., die size). For instance, changing the positions of through-wafer source vias may improve RF performance at the expense of increased thermal resistance of the device, increased cost of the device (e.g., due to an increase in die size), or both. In existing RF power FET layouts, for example, source vias positioned outside an array of gates may lead to increased source inductance and increased size. On the other hand, existing layouts with source vias embedded inside the array of gates may lead to non-uniform gate pitch, which may compromise the thermal resistance of the device.

The tradeoffs are often especially undesirable for GaN devices. The cost per unit die area is much higher for GaN devices than for silicon or Gallium arsenide (GaAs) devices.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

FIG. 2 is a schematic, cross-sectional view of the semiconductor device of FIG. 1 taken along lines 2-2 of FIG. 1.

FIG. 3 is a schematic, cross-sectional view of the semiconductor device of FIG. 1 taken along lines 3-3 of FIG. 1.

DETAILED DESCRIPTION OF THE PRESENTLY PREFERRED EMBODIMENTS

Figure 1:
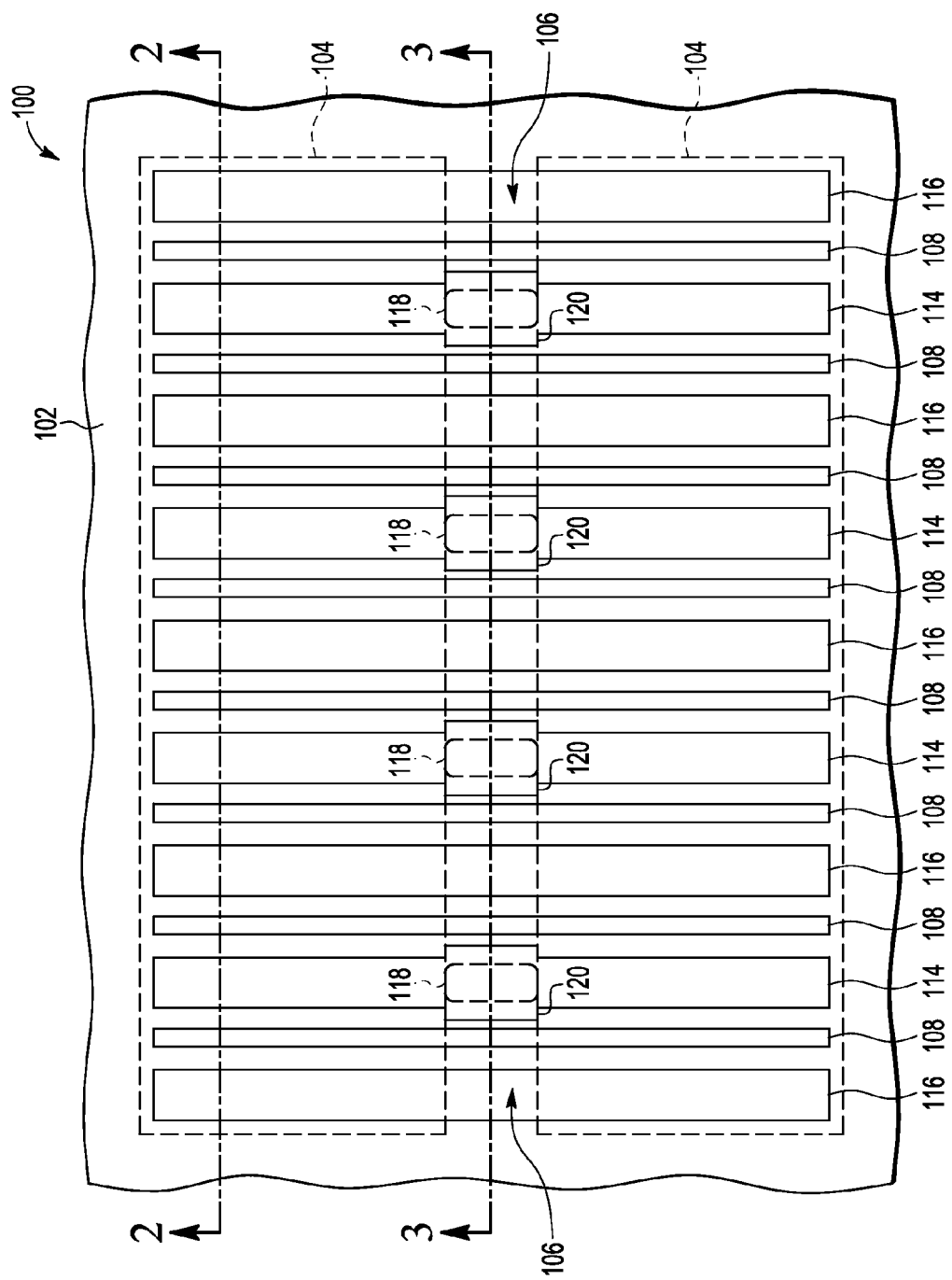
FIG. 1 is a schematic, plan view of a semiconductor device having source vias in accordance with one embodiment.

Semiconductor devices having vias (e.g., through-wafer vias) disposed in a central or other inner inactive region are described. The semiconductor devices may be FET devices having a layout in which a source terminal is grounded by the through-wafer via. The inactive region is disposed between two active regions of the FET or other transistor device. The location of the vias may provide a layout that provides advantages without detrimentally affecting other device characteristics. For example, the layout may reduce thermal resistance with no penalty in cost or RF performance. More generally, the location of the through-wafer vias may be used to provide a layout with improved RF performance, thermal resistance, and/or cost.

The active area of the semiconductor device is segmented or divided into two or more regions or areas by one or more inactive areas. Each inactive area does not include FET or other transistor structures therein, although the active areas may share terminal connections. The terminals of the semiconductor device may run across the inactive area to establish source, gate, and drain connections (or other conduction or control terminal connections) on either side of the inactive area.

The inactive area in which the vias are located may be sandwiched between a pair of active regions. The inactive area may have a width and/or otherwise be laterally dimensioned or configured to accommodate a single row of vias. The row of vias may be centered along a lateral dimension (e.g., length) of a conduction terminal (e.g., source terminal) or otherwise placed in the inactive region to provide a ground connection or other reference voltage for the two active areas. Each via may be configured as a slot via.

The inactive region in which the vias are embedded may be disposed at or near the center of each gate or other control terminal finger. The central positioning of the vias may lead to a decrease in source or other common or conduction terminal inductance. For example, the inductance of the source terminals with central vias may be lower than layouts having source vias disposed along one side or end of the transistor device. With the decrease in source inductance, the disclosed embodiments may provide higher gain during operation at high frequencies.

The vias provide lower inductance without increasing die size or the aspect ratio of the die. The die size need not increase in a lateral direction to accommodate the vias. The central or inner positioning of the vias may also maintain a low inductance for the conduction terminals extending in either direction from the source via. In contrast, the length of the terminals may thus not be limited by concerns regarding inductance, as is the case when the vias are located at one end of the conduction terminals. For these and/or other reasons, the aspect ratio of the die may thus be improved and/or not increase while improving the common terminal inductance and, accordingly, RF performance.

The vias may provide lower inductance without increasing thermal resistance. Thermal resistance may, in fact, improve (i.e., decrease) because the peak temperature of the devices may be reduced by the central or other inner location of the vias and the inactive region in which the vias are disposed. The thermal resistance may also not increase because of the uniformity of the gate (or other control terminal) pitch. For example, thermal resistance problems arising from gates being disposed in closely spaced pairs may thus be avoided.

The disclosed embodiments may thus lead to equal or superior die size, aspect ratio, thermal resistance, and gain relative to other layouts having common terminal vias in other positions. The disclosed embodiments may be used to reduce cost for a given RF performance level and a given thermal resistance level. The disclosed embodiments may alternatively provide improvements in RF performance and/ or thermal resistance for a given cost level.

In some embodiments, the control terminal (e.g., gate) pitch is different in the sandwiched inactive region. Those embodiments nevertheless present a good thermal design. Even when gates are closer to one another in the inactive region, there is no thermal penalty because there is no channel in the inactive area. In the inactive area, the gate amounts to a metal or other conductive line extending over an insulator. As a result, no heat is generated in the locations in which the gate pitch is different.

The gate pitch may be varied in the inactive region if a straight gate finger would be deemed to pass too close to the source vias. A design rule may establish a minimum spacing between the gate and the source vias to avoid, for instance, gate-to-source leakage. In some cases, each gate finger may be routed away from the vias. However, such routing does not impose a thermal penalty, as there would be if a channel were formed in connection with closely spaced gate fingers. Thus, even if the gate pitch is varied to avoid leakage, the disclosed embodiments do not push the gates into pairs or set the minimum gate pitch according to the source via.

The layout of the disclosed embodiments may be configured to achieve a desired level of gate pitch uniformity or non-uniformity in the active areas. The gate pitch may be as uniform as desired in the active areas of the transistor.

Although described below in connection with AlGaN/ GaN HFET devices, the positioning of the source vias is well suited for use in connection with other devices. For example, the disclosed devices may utilize a wide variety of semiconductor materials, including other types of Group III-nitride semiconductor materials (e.g., InAlN and InGaN). The disclosed devices are also not limited to Group III-nitride semiconductor devices, and may instead include other compound semiconductor materials, such as non-nitride-based compound semiconductors (e.g., GaAs) and Group II-Group VI semiconductor materials. For instance, the source vias of the disclosed embodiments are also applicable to GaAs FET devices. Furthermore, the devices may be bipolar junction transistor devices rather than FET devices. For example, the vias may be emitter vias rather than source vias.

The disclosed embodiments are also not limited to compound semiconductor substrates or particular types of FET devices. For example, the source vias may be provided for laterally double diffused metal-oxide-semiconductor (LDMOS) devices and other silicon-based devices as well.

The disclosed devices are not limited to particular HFET device configurations. For example, one or more aspects of the disclosed devices and methods may be applied in connection with metal-semiconductor FET (MESFET) or metal-insulator-semiconductor HFET (MISHFET) devices. The disclosed devices are accordingly not limited to device structures having un-doped semiconductor layers.

The disclosed embodiments are also not limited to device configurations directed to a particular application or a high voltage context. The disclosed embodiments may be used in a wide variety of contexts and applications, including but not limited to, RF, power switching, and high frequency applications.

FIG. 1 is a schematic, plan view of an exemplary transistor device 100 having a through-wafer via arrangement in accordance with one embodiment. The transistor device 100 may be configured as an HFET or HEMT device. The transistor device 100 includes a number of structures supported by a semiconductor substrate 102. In this example, the structures of the transistor device 100 are configured in a discrete device arrangement. The discrete device arrangement may be a three-terminal device arrangement in which an input is provided in parallel to a number of input or control terminals (e.g., gate terminals) that control a number of output or conduction terminals (e.g., drain or other charge carrier output terminals) also connected in parallel to provide an output. A ground or other reference voltage may be provided in parallel to a number of common node conduction terminals (e.g., source or other charge carrier input terminals). Other device arrangements may be provided, including, for example, various arrangements in which any number of devices are arranged in an integrated circuit formed on the semiconductor substrate 102.

The transistor device 100 is formed in and over a pair of active areas 104 and an inactive area 106 of the semiconductor substrate 102. The inactive area 106 is sandwiched or otherwise disposed between the pair of active areas 104. The active areas 104 may be separated by one or more regions or areas in addition to the inactive area 106. For example, one or more additional inactive areas may be disposed between the active areas 104 and the inactive area 106. In the embodiment of FIG. 1, the active areas 104 are discrete active areas, or areas not contiguous with any other active areas. In other embodiments, one or both of the active areas 104 may be contiguous or connected with one or more active areas of the semiconductor substrate 102. For example, the active areas 104 may be connected with one another in an area not shown in FIG. 1 (e.g., an area laterally spaced from the inactive area 106). In an alternative embodiment, the active areas 104 may be connected with one another by one or more additional active areas at one or both lateral ends of the transistor device 100 (i.e., at the end(s) of the inactive area 106).

The transistor device 100 includes one or more control terminals 108 supported by the semiconductor substrate 102. In this example, each control terminal 108 is configured as a gate terminal. In other embodiments, the control terminals 108 may be base terminals of a bipolar transistor device. Each gate 108 may have an elongated shape or be otherwise configured as a finger. In some embodiments, the gates 108 may be electrically connected to one another to act as a single gate. For example, the gates 108 may be electrically connected by one or more metal or other conductive lines or other structures (not shown) disposed along ends of the gates 108. Alternatively, the gates 108 may be electrically separated from one another for control of, for instance, individual transistor structures of the transistor device 100.

Each gate 108 extends across the pair of active areas 104 and the inactive area 106 to define a conduction path through the semiconductor substrate 102 during operation between a pair of conduction regions in the semiconductor substrate 102. In this example, the conduction path is a channel between a source region 110 (FIG. 2) and a drain region 112 (FIG. 2). As shown in FIG. 2, the source and drain regions 110, 112 are disposed along a respective one of the gates 108. The source and drain regions 110, 112 are disposed in both active areas 104 under conduction terminals 114, 116, respectively. In this example, the conduction terminals 114, 116 are configured as source and drain terminals 114, 116.

In bipolar embodiments, the conduction path is formed during operation between emitter and collector regions in the semiconductor substrate 102. The emitter region may correspond with the source region 110, and the collector region may correspond with the drain region 112.

The source and drain terminals 114, 116 are supported by the semiconductor substrate 102. As shown in FIGS. 1 and 2, the source and drain terminals 114, 116 are disposed on opposing sides of the gates 108. The source and drain terminals 114, 116 may have an elongated shape or be otherwise configured as fingers. The source and drain fingers or other terminals 114, 116 may be elongated in the same direction in which the gate fingers 108 are elongated, e.g., as parallel lines.

Each source finger 114 extends across the pair of active areas 104 and the inactive area 106. The source regions 110 on either side of the inactive area 106 may thus be electrically connected to one another. Each drain finger 116 extends across the pair of active areas 104 and the inactive area 106. The drain regions 112 on either side of the inactive area 106 may thus be electrically connected to one another.

In some embodiments, the source terminals 114 are electrically connected to one another, e.g., as a common source. For example, the source terminals 114 may be electrically connected to a ground terminal. In these and/or other embodiments, the drain terminals 116 are electrically connected to one another to act as a common or single drain. For example, the drain terminals 116 may be electrically connected by one or more metal or other conductive structures (not shown) disposed along ends of the drain terminals 108. The ends may be opposite of the ends at which the gates 108 are connected. Alternatively, the drain terminals 116 may be electrically separated from one another for operation of, for instance, individual transistor structures of the transistor device 100.

The transistor device 100 includes one or more source vias 118 in the inactive area 106. With the inactive area 106 disposed between the active areas 104, the source vias 118 may thus be considered inner or internal vias. The source vias 118 may thus be distinguished from other types of source vias located along the outer, or outward facing, ends or sides of the active areas 104. The source vias 118 are accordingly spaced from the lines or other conductive structures used to establish electrical connections for the drain terminals 116 and the gate terminals 108.

Each source via 118 may be configured as a through-wafer via as shown in FIG. 2. Each source via 118 is electrically connected to, and extends from, a respective one of the source terminals 114. Each source via 118 may be configured to electrically connect or tie each source terminal 114 to a ground terminal 120 (FIG. 2) or other terminal of the transistor device 100. The ground terminal 120 may be disposed on a backside of the semiconductor substrate 102. In other embodiments, the terminal to which the source vias 118 connect may not be disposed on a backside of the semiconductor substrate 102.

The source vias 118 may be arranged in a single row in the inactive area 104 as shown in FIG. 1. The row and, thus, each source via 118, may be centered along a lateral dimension of each source terminal 114 and, more generally, the transistor device 100. The lateral dimension corresponds with the direction in which the source terminals 114 extend across the active areas 104 and the inactive area 106. The lateral dimension may be referenced herein as the length of the transistor device 100 or the source terminal 114. In other embodiments, the source vias 118 may not be aligned and centered as shown in FIG. 1, and instead disposed in a variety of lateral arrangements.

Each source via 118 may be elongated in a direction corresponding with the length dimension of the transistor device 100. Each source via 118 may thus be configured as a slot via. The length of the slot may correspond with the lateral size (e.g., width) of the inactive area 106. For example, each source via 118 may have a length equal to, or about equal to, the lateral size of the inactive area 106. In other embodiments, each source via 118 is not as long as the width of the inactive area 106.

In the embodiment of FIG. 1, the width of each source via 118 may correspond with a primary width of the respective source terminal 114 to which the source via 118 is connected. For example, the source via 118 may have a width equal to, or about equal to, the width of the source terminal 114 in the active areas 104. Alternatively, the width of the source via 118 may be less than or greater than the width of the source terminal 114 in the active areas 104.

Each source terminal 114 may be widened in the inactive area 106. As shown in the example of FIG. 1, each source terminal 114 includes a tab 120 that extends laterally outward toward each gate finger 108. The increase in width may allow the source via 118 to be wider than otherwise possible given the width of the source terminals in the active areas 104. For example, the source vias 118 may be about as wide or wider than the source terminals in the active areas 104. A wider source via may, in turn, allow the aspect ratio of the source via 118 to be more suitable for purposes of etching or other via fabrication procedures.

In the embodiment of FIG. 1, the gate fingers 108 are configured such that the transistor device 100 has a uniform gate pitch. The gate fingers 108 are equally spaced from one another. Such equal spacing may be useful in connection with maintaining a low thermal resistance for the transistor device 100. For example, the equal spacing distributes the heat generated under each gate finger 108 in the active areas 104 adjacent the drain terminal 116.

The uniform gate pitch shown in FIG. 1 may be made possible by sufficient lateral spacing between the source vias 118 and the gate fingers 108 in the inactive area 106. The lateral spacing may prevent or reduce gate leakage. Otherwise, if the source vias 118 are too close to the gate fingers 108, then the formation of the source vias 118 may create a current path from the gate finger 108 to ground.

The spacing, sizes, and other dimensions of the terminals and other features of the transistor device 100 may vary. In some embodiments, the width of the source and drain terminals 114 and 116 falls in a range from about 5 to about 100 microns, with the width of the source terminal 114 expanding at the tabs 120 to a range from about 20 to about 120 microns. In such cases, the source vias 118 may have a width from about 10 to about 80 microns. The length of the source vias 118 (and/or the width of the inactive area 106) may fall in a range from about 10 to about 100 microns. The length of each active area 104 may fall in a range from about 20 to about 500 microns. The gate fingers 108 may have a width from about 0.5 to about 5 microns, and may be spaced from the source and drain terminals 114 and 116 in the active areas 104 from about 0.5 to about 25 microns. Other dimensions may be used.

FIG. 2 is a cross-sectional view of the transistor device 100 to depict the active areas 104 of the semiconductor substrate 102 in greater detail. The semiconductor substrate 102 includes a base substrate 130 and a number of semiconductor layers grown or otherwise formed on the base substrate 130. The base substrate 130 may be or include silicon carbide (SiC). The base substrate 104 may include alternative or additional materials, such as sapphire, Si, GaAs, GaN, AlN, diamond, poly-SiC, SiC on insulator, silicon on insulator, and other substantially insulating materials. The semiconductor layers may be epitaxially grown. In some embodiments, such as GaN embodiments, one or more of the semiconductor layers are Group III-nitride semiconductor layers. Further details regarding examples having GaN-based substrates are provided below.

The gate, source, and drain terminals 108, 114, 116 are disposed on a front or upper side 132 of the semiconductor substrate 102. The front side 132 may be passivated by one or more dielectric layers. In this example, a single dielectric layer 134 is deposited on the semiconductor substrate 102 and patterned to define the terminals 108, 114, 116. The dielectric layer 134 may be or include silicon nitride. Additional or alternative dielectric materials may be used.

In the embodiment of FIG. 2, the transistor device 100 includes a metal layer 138 disposed on a back or lower side 136 of the semiconductor substrate 100 opposite the front side 132. The metal layer 138 may cover the entire back side 136 as a ground plane. Alternatively, the back side 136 may be selectively covered by a patterned metal layer 138. Alternative or additional features may be provided on the back side 136. For example, a number of solder or other bumps (not shown) may be disposed on the metal layer 138 or otherwise supported by the semiconductor substrate 102. The solder bumps may configure the metal layer 138 to be soldered to a ground plane (not shown) of the transistor device 100 or other element of the packaging or installation site of the transistor device 100.

In the embodiment of FIGS. 1 and 2, one or more heterojunction structures are formed in the semiconductor substrate 102 on the base substrate 130. The semiconductor substrate 102 includes multiple semiconductor layers supported by the base substrate 130. The semiconductor layers may be configured in a heterostructure arrangement configured to form a channel between the source and drain regions 110, 112 during operation. Each of the semiconductor layers may be a Group III-nitride semiconductor epitaxial layer. In other embodiments, one or more of the semiconductor layers are not epitaxially grown. Other embodiments may not rely on heterostructure arrangements for channel formation. For example, channels may be formed in some embodiments through inversion of a doped body region of a semiconductor substrate (e.g., a silicon substrate).

In heterostructure embodiments, a buffer/channel layer 140 is grown on the base substrate 104 and configured as a channel and buffer of the transistor device 100. A bottom or buffer portion of the buffer/channel layer 140 may include undoped (or not intentionally doped) GaN. Alternatively, the buffer portion may include GaN doped with a p-type dopant such as C or Fe at a level of about $10^{17}$ to about $10^{19}$ cm$^{-3}$ to render the buffer portion highly resistive. In embodiments in which the bottom portion is doped, the dopants may be intentionally incorporated during the first 0.1 to 1 um of epitaxial growth. Undoped subsequent material may then be grown, albeit with the possible incorporation of doping due to "memory effects" present during growth. Alternatively, the buffer portion of the buffer/channel layer 140 may include $Al_xGa_{1-x}N$ where the Al mole fraction, X, is between 0.03 and 0.06. The $Al_xGa_{1-x}N$ may be doped or undoped. An upper or channel portion of the buffer/channel layer 140 may be generally an undoped lower bandgap material relative to a barrier layer 142 (e.g. AlGaN), such as GaN or $In_xGa_{1-x}N$ where X is between 0 and 1. The channel portion may be optimized for optimal electron transport and device speed by minimizing the amount of alloy and impurity scattering by avoiding Al-containing alloys or high levels of dopants. The AlGaN barrier layer 142 is disposed on and adjacent to the buffer/channel layer 140. A GaN cap layer 144 is disposed on and adjacent to the barrier layer 108. The cap layer 142 may define a surface of the front side 132 of the semiconductor substrate 102. One or more of the buffer/channel, barrier, and/or cap layers 140, 142, 144 may be doped, un-doped, or unintentionally doped.

The stress-induced polarization resulting from epitaxial growth of the AlGaN and GaN layers develops a two-dimensional electron gas at the interface between the channel and barrier layers 140 and 142. The two-dimensional electron gas provides charge carriers for conduction between the source regions 110 and the drain regions 112 during operation. The GaN cap layer 144 may provide protection for the channel and barrier layers 140 and 142 during subsequent processing steps and may be configured to lower gate leakage.

Other semiconductor materials may be used in the channel, barrier, and/or cap layers 140, 142, 144. In some cases, other Group III-nitride semiconductor materials are used. Such materials may include other binary, ternary, and quaternary compounds. For example, other materials, such as InGaN, may be used for the channel layer 140 that have a bandgap less than the bandgap of the barrier layer 142, as well as a higher electron affinity than the barrier layer 142. Also, $In_xAl_{1-x}N$, where X may but need not be selected to achieve a lattice match with the channel portion of the buffer/channel layer 140, may be used for the barrier layer 142. One or more of the channel, barrier, and/or cap layers 140, 142, 144 may be a composite layer.

In other embodiments, additional semiconductor layers may be incorporated into the heterostructure arrangement. For example, buffer, nucleation, and/or transition semiconductor layers may be included in the semiconductor substrate 102. For instance, an AlN interbarrier layer may be used between the barrier layer 142 and the buffer/channel layer 140.

One or more isolation regions 146 are formed in the semiconductor substrate 102 to define the outer, or outward facing, lateral periphery of the active areas 104. The isolation regions 146 may be formed via an implantation procedure configured to damage the epitaxial and/or other semiconductor layers of the semiconductor substrate 102. The inactive area 106 (FIG. 1) may be formed via the implantation procedure used to form the isolation regions 146. The configuration and/or fabrication of the isolation regions 146 and the inactive area 106 may vary. For example, the isolation regions 146 and the inactive area 106 may be configured as isolation trenches filled with one or more dielectric materials. In other embodiments, the active areas 104 of the transistor device 100 are defined via a mesa-etched structure supported by the base substrate 130 and configured to define the active areas 104. The semiconductor substrate 102 may thus include such mesa-etched and other semiconductor structures.

In this example, the gate fingers 108 are configured as Schottky gates. Each gate finger 108 is disposed on the cap layer 144. A variety of materials may be used to form the Schottky contact of the gate fingers 108, such as one or more of Ni, Pt, $NiSi_x$, Cu, Pd, Cr, W, etc. The gate fingers 108 may be T-shaped, with a vertically oriented stem in contact with, and extending upward from, the cap layer 144 as shown. In other embodiments, the gate fingers 108 may be recessed stopping in the AlGaN barrier layer 142 or on an interbarrier layer (e.g., an AlN layer) between the barrier layer 142 and the buffer/channel layer 140. The gate fingers 108 may not be Schottky gates. In other embodiments, the gate fingers 108 are spaced from the semiconductor substrate 102 by a dielectric layer, such as a silicon dioxide layer.

Ohmic contacts are formed for the source and drain terminals 114, 116. In this example, the ohmic contacts are disposed on the surface of the front side 132 of the semiconductor substrate 102 and are thus deposited on the cap layer 144. In other embodiments, the ohmic contacts are formed in recesses in the semiconductor substrate 102, in which case the ohmic contacts may be deposited on, for instance, the barrier layer 142.

FIG. 3 is a cross-sectional view of the transistor device 100 to depict the inactive area 106 of the semiconductor substrate 102 in greater detail. The inactive area 106 is defined by a lattice damage region 150 in the semiconductor substrate 102. The lattice damage region 150 may extend from the surface of the semiconductor substrate 102 to a depth beyond the depth of the barrier and cap layers 142, 144 (FIG. 2). In this embodiment, the lattice damage region 150 overlaps the channel layer 140, leaving a lower portion 152 of the channel layer 140 undamaged. The depth of the lattice damage region 150 may correspond with the depth of the isolation regions 146 (FIG. 2). The depth of the lattice damage region 150 may vary. For example, a lower boundary of the lattice damage region 150 may be deeper than a lower boundary of the channel layer 140.

The source vias 118 extend through the semiconductor substrate 102 to electrically connect the source terminals 114 with the back side metal layer 138. In this embodiment, each source via 118 extends through the lattice damage region 150, the lower portion of the channel layer 140, and the base substrate 130.

As shown in FIG. 3, the source terminals 114 may be wider than the drain terminals 116 in the inactive area 106. The width of each source terminal 114 may be increased via a respective one of the tabs 120 to accommodate the width of each source via 118. In other embodiments, each source terminal 114 has a uniform width along the entire length of the source terminal 114.

The exemplary embodiment shown in FIG. 1 may include a number of other structures to facilitate connections to the gates 108 and the source and drain terminals 114, 116. For instance, the transistor device 100 may include a number of patterned metal layers (not shown) for connections to the gates 108 and the source and drain terminals 114, 116. One or more inter-layer dielectric (ILD) layers (not shown) may be deposited to isolate the metal layers and/or for device passivation. The transistor device 100 may also include field plates (not shown) deposited between the ILD layers to shield the gates 108 from high voltages applied to one of the drain terminals 116.

Figure 4:
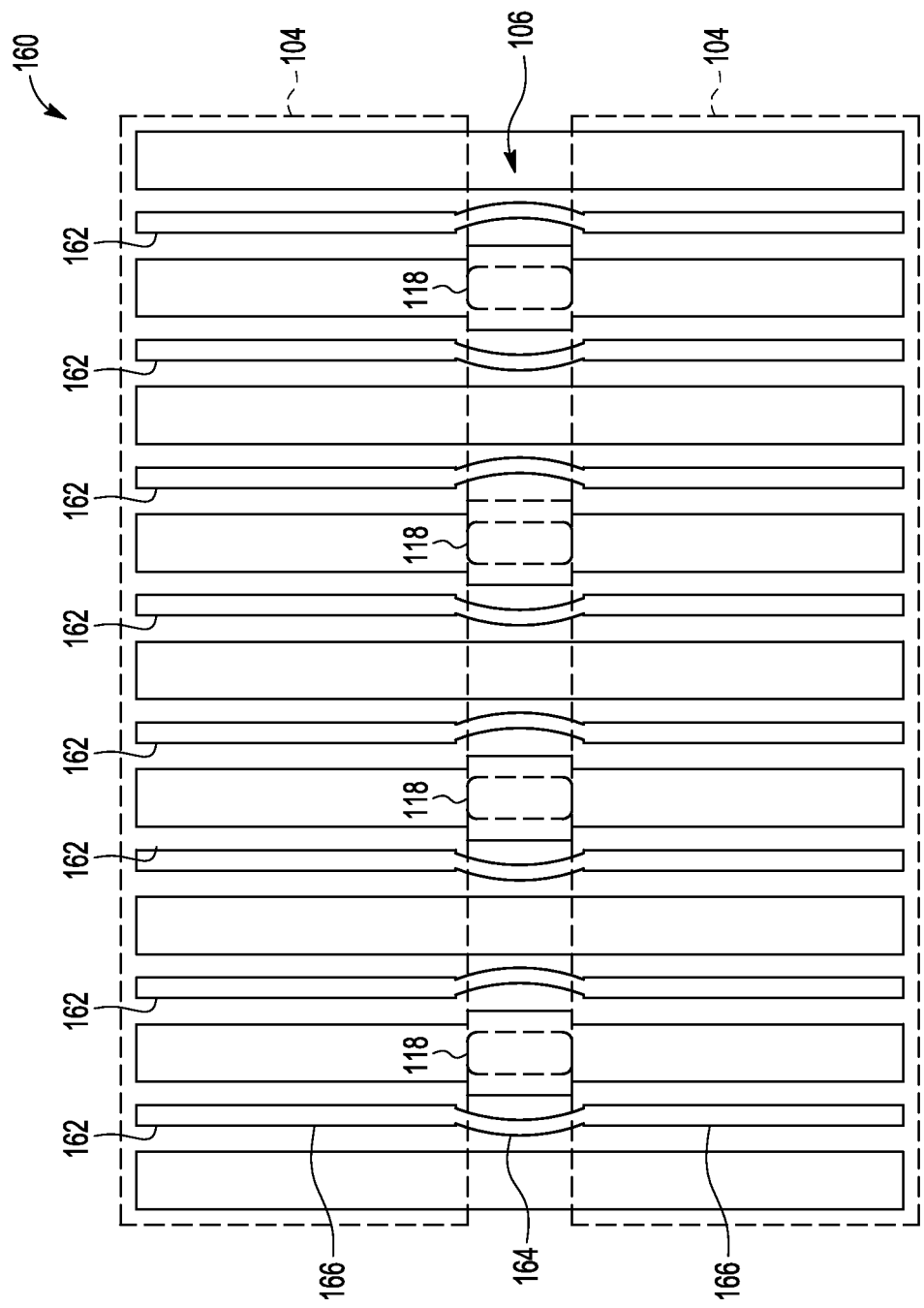
FIG. 4 is a schematic, plan view of another semiconductor device having source vias in accordance with one embodiment.

FIG. 4 is a plan view of a transistor device 160 configured in accordance with one embodiment having a non-uniform gate pitch. The transistor device 106 may be configured similarly to the embodiments described above, with the exception of the layout of gate fingers 162. The layout of the gate fingers 162 is configured to reduce or prevent gate leakage that may otherwise arise from the proximity of the source vias 118 and the gate fingers 162. The layout results in a gate pitch that varies between the active areas 104 and the inactive area 106.

The gate fingers 162 are shaped to increase or maximize the spacing from the source vias 118. In the embodiment of FIG. 4, each gate finger 162 is bowed away from a respective source via 118 in the inactive area 106. Each gate finger 162 includes a curved portion 164 between a pair of straight line portions 166. The extent to which the curved portion 164 bends away from the source via 118 may vary. The layout of the gate fingers 162 may include non-bowed shapes. In other embodiments, the gate fingers 162 may include one or more additional straight line portions to increase the gate-via spacing. For example, three additional straight line portions may be disposed in a C-shaped arrangement.

The adjustment of the gate pitch may be limited to the inactive area 106. In the example of FIG. 2, the curved portion 164 begins to extend beyond the lateral positioning of the rest of the gate finger 162 at about the point that the inactive area 106 begins. With the curved portion 164 only in the inactive area 106, any effects on thermal resistance are accordingly reduced, minimized, or absent.

Figure 5:
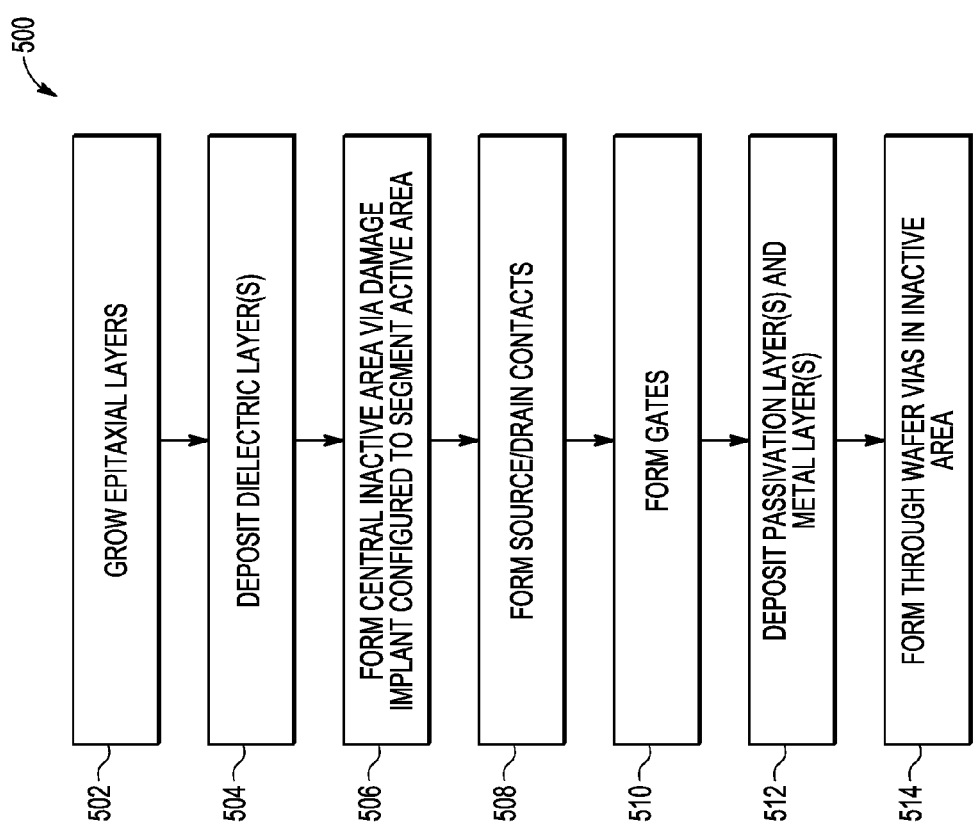
FIG. 5 is a flow diagram of an exemplary method of fabricating a semiconductor device having source vias in accordance with another embodiment.

FIG. 5 shows an exemplary method 500 of device fabrication involving centrally disposed vias (e.g., source vias) in accordance with one embodiment. The method includes a sequence of acts, only the salient of which are depicted for convenience in illustration. For example, the method may include a number of acts directed to preparing a base substrate for the fabrication method. The ordering of the acts may vary in other embodiments. For example, an isolation implant procedure may be implemented after the formation of the source and drain contacts.

The method may begin with an act 502 in which a number of epitaxial semiconductor layers are grown on a base substrate (e.g., SiC). The epitaxial semiconductor layers may be grown via one or more techniques, including, for instance, molecular beam epitaxy (MBE), metal-organic chemical vapor deposition (MOCVD), and hydride vapor phase epitaxy (HVPE). The growth of the epitaxial semiconductor layers includes defining a channel of the semiconductor device in a semiconductor substrate. In this example, the channel is defined by growing a GaN or other epitaxial Group III-nitride semiconductor layer on the base substrate. One or more additional epitaxial Group III-nitride semiconductor layers may be grown on the GaN channel layer to define, for instance, a barrier layer and a cap layer. With the growth of these and/or other semiconductor layers, the surface of the semiconductor substrate is defined for the active areas of the semiconductor device. One or more of the channel, barrier, and/or cap layers may be deposited via non-epitaxial techniques.

The surface of the semiconductor substrate is passivated in an act 504. Passivation of the surface may include the deposition of one or more dielectric layers. The dielectric layers may include silicon nitride (e.g., $Si_3N_4$) deposited via a low pressure chemical vapor deposition (LPCVD) procedure. In some embodiments, the silicon nitride or other dielectric material is deposited via a technique other than an LPCVD procedure. For example, atomic layer deposition (ALD), PECVD, sputtering, evaporation, LPCVD, electron-cyclotron resonance (ECR) deposition, inductively coupled plasma (ICP), hot-wire CVD (HWCVD), catalytic CVD (CAT-CVD), MOCVD, MBE, HVPE or other suitable procedures may be used.

In act 506, an inactive area is formed in the semiconductor substrate. In some embodiments, the inactive area is formed through a damage implant. The inactive area may be formed at the same time that one or more isolation regions are formed. The inactive area and isolation regions may be defined by patterning of a photoresist layer and subsequent implantation. After the isolation implant, the photoresist may then be removed. Other techniques may be used, including, for instance, procedures in which the semiconductor substrate is selectively removed (e.g., by etching) and filled with a dielectric material. The inactive area defines a pair of active areas separated or segmented by the inactive area, as described above. In some embodiments, the active area segments are equal in size such that the inactive area is centered. The timing of the inactive area formation may vary. For example, the inactive region may be formed after formation of the ohmic contacts for conduction (e.g., source and drain) terminals.

In act 508, the ohmic contacts of the source and drain terminals may be defined by patterning (e.g., dry etching) of the dielectric layer(s) passivating the surface of the semiconductor substrate. In preparation for the dry etch or reactive ion etch (RIE) procedure, a layer of photoresist is applied and patterned as shown. Various plasma etchants may then be used to remove the dielectric layer, including, for instance, Fluorine-based etchants, such as $SF_6$, $CF_4$, etc. Other etch procedures (e.g., wet etch procedures) may be used to remove other dielectric materials at the surface of the semiconductor substrate.

Source and drain terminals (or contacts) are then formed over the semiconductor substrate. Each source and drain terminal may extend across the pair of active areas and the inactive area, as shown and described in connection with FIG. 1. Each source terminal is electrically connected to a respective one of the source vias, as described above and shown in FIG. 3. In one embodiment, the contact metals include titanium (Ti), nickel (Ni), molybdenum (Mo), and gold (Au).

Gates or other control terminals are formed in an act 510 over the semiconductor substrate. Each gate extends across the pair of active areas and the inactive area. As described above, the formation of each gate defines source and drain regions (or other conduction regions) in each active area. Each source and drain region is electrically connected to respective source and drain terminals. A gate area is defined for each gate by patterning a photoresist layer and dry etching the $Si_3N_4$ or other dielectric layer to form an opening therein. For example, an RIE procedure may be used to the opening. The opening may be used to define the stem of each gate. Any one of the plasma etchants referenced above may be used. A gate structure is then formed in the gate area to form either a Schottky gate or a metal-insulator gate. One or more gate metal layers may be deposited via evaporation, sputtering, or other techniques. In one embodiment, the gate metals include Nickel (Ni) and Gold (Au), with an optional Palladium (Pd) layer deposited on the Ni—Au structure. A metal lift-off procedure is then implemented to remove the photoresist layer.

As described above, the gate fingers may be configured such that the semiconductor device has a uniform gate pitch. The uniform gate pitch may be provided across the entire length of the transistor device, or only in the active areas thereof. The transistor device may have a non-uniform gate pitch in the inactive area, as described above. The gate pitch may thus vary between the pair of active areas and the inactive area.

In act 512, one or more dielectric passivation layers and one or more metal layers are deposited. Some passivation layers (e.g., silicon nitride) may be deposited via, for instance, a sputtering procedure. Other procedures may be used, including, for instance, PECVD, ICP, ECR-based deposition techniques.

A number of vias may then be formed in the inactive area in an act 514. Each via may be a through-wafer via. The formation of the vias may include mechanical procedures, chemical processing (e.g., wet or dry etching), or any combination thereof. The etching or other formation of the vias may be initiated from the back side of the substrate. The vias may be configured as described above.

The disclosed embodiments may include or be directed to fabricating transistor devices disposed in a metal-insulator gate configuration. For example, the transistor devices may be configured as a MISFET or MISHFET device. The gates of the disclosed embodiments may thus be disposed in arrangements other than those involving Schottky contacts. In other embodiments, the transistor devices may be configured as bipolar transistor devices, in which the above-described vias are associated with emitter terminals of the device.

In a first aspect, a semiconductor device includes a semiconductor substrate including an inactive area and a pair of active areas separated by the inactive area, a control terminal supported by the semiconductor substrate and extending across the pair of active areas and the inactive area to define a conduction path during operation between a first conduction region in each active area and a second conduction region in each active area, a conduction terminal supported by the semiconductor substrate and extending across the pair of active areas and the inactive area for electrical connection to each source region, and a via extending through the semiconductor substrate, electrically connected to the source terminal, and positioned in the inactive area.

In a second aspect, a transistor device includes a semiconductor substrate including a pair of active areas and an inactive area disposed between the pair of active areas, a plurality of control terminal fingers supported by the semiconductor substrate, each control terminal finger extending across the pair of active areas and the inactive area to define a conduction path during operation between a first conduction region in each active area and a second conduction region in each active area, a plurality of conduction terminal fingers supported by the semiconductor substrate, each conduction terminal finger extending across the pair of active areas and the inactive area for electrical connection to a respective first conduction region in each active area, and a plurality of vias extending through the semiconductor substrate, each via being positioned in the inactive area and electrically connected to a respective conduction terminal finger of the plurality of conduction terminal fingers.

In a third aspect, a method of fabricating a semiconductor device includes forming an inactive area in a semiconductor substrate, the inactive area defining a pair of active areas separated by the inactive area, forming a via through the semiconductor substrate in the inactive area, forming a conduction terminal over the semiconductor substrate that extends across the pair of active areas and the inactive area, the conduction terminal being electrically connected to the via, and forming a control terminal over the semiconductor substrate that extends across the pair of active areas and the inactive area to define a conduction region in each active area electrically connected to the conduction terminal.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A semiconductor device comprising:
 a semiconductor substrate comprising an inactive area and a pair of active areas separated by the inactive area;
 a control terminal supported by the semiconductor substrate and extending across the pair of active areas and the inactive area to define a conduction path during operation between a first conduction region in each active area and a second conduction region in each active area;
 a conduction terminal supported by the semiconductor substrate and extending across the pair of active areas and the inactive area for electrical connection to each first conduction region; and
 a via extending through the semiconductor substrate, electrically connected to the conduction terminal, and positioned in the inactive area.

2. The semiconductor device of claim 1, wherein the control terminal is one of a plurality of gate fingers supported by the semiconductor substrate and extending across the pair of active areas and the inactive area.

3. The semiconductor device of claim 2, wherein:
 the conduction terminal is one of a plurality of source fingers supported by the semiconductor substrate, extending across the pair of active areas and the inactive area; and
 the via is one of a plurality of source vias arranged in a single row in the inactive area, each source via being electrically connected to a respective one of the plurality of source fingers.

4. The semiconductor device of claim 2, wherein the plurality of gate fingers are configured such that the semiconductor device has a uniform gate pitch.

5. The semiconductor device of claim 2, wherein a pitch of the plurality of gate fingers varies between the pair of active areas and the inactive area.

6. The semiconductor device of claim 5, wherein:
 the conduction terminal is one of a plurality of source fingers supported by the semiconductor substrate, extending across the pair of active areas and the inactive area;
 the via is one of a plurality of source vias, each source via being electrically connected to a respective one of the plurality of source fingers; and
 each gate finger is bowed away from a respective source via of the plurality of source vias in the inactive area.

7. The semiconductor device of claim 1, the via is elongated in a direction in which the conduction terminal extends across the pair of active areas and the inactive area.

8. The semiconductor device of claim 1, further comprising a metal layer disposed on a back side of the semiconductor substrate opposite a front side of the semiconductor substrate on which the control terminal is supported, wherein:
 the via is electrically connected to the metal layer; and
 the metal layer is configured to be soldered to a ground plane of the semiconductor device.

9. The semiconductor device of claim 1, wherein the via is centered along a lateral dimension of the conduction terminal, the lateral dimension corresponding with a direction in which the conduction terminal extends across the pair of active areas and the inactive area.

10. A transistor device comprising:
 a semiconductor substrate comprising a pair of active areas and an inactive area disposed between the pair of active areas;
 a plurality of control terminal fingers supported by the semiconductor substrate, each control terminal finger extending across the pair of active areas and the inactive area to define a conduction path during operation between a first conduction region in each active area and a second conduction region in each active area;
 a plurality of conduction terminal fingers supported by the semiconductor substrate, each conduction terminal finger extending across the pair of active areas and the inactive area for electrical connection to a respective first conduction region in each active area; and
 a plurality of vias extending through the semiconductor substrate, each via being positioned in the inactive area and electrically connected to a respective conduction terminal finger of the plurality of conduction terminal fingers.

11. The transistor device of claim 10, wherein the plurality of control terminal fingers are configured such that the semiconductor device has a uniform control terminal pitch.

12. The transistor device of claim 10, wherein a pitch of the plurality of control terminal fingers varies between the pair of active areas and the inactive area.

13. The transistor device of claim 10, wherein each control terminal finger is bowed away from a respective via of the plurality of vias in the inactive area.

14. The transistor device of claim 10, wherein each via of the plurality of vias is centered along a lateral dimension of a respective conduction terminal finger of the plurality of conduction terminal fingers, the lateral dimension corresponding with a direction in which the respective conduction terminal finger extends across the pair of active areas and the inactive area.

15. The transistor device of claim 10, wherein:
 each control terminal finger is configured as a gate terminal;
 each conduction terminal finger is configured as a source finger;
 each first conduction region is configured as a source region;
 each second conduction region is configured as a drain region; and
 the semiconductor substrate comprises a base substrate and a Group III-nitride semiconductor layer grown on the base substrate, the base substrate comprising silicon carbide.

16. A method of fabricating a semiconductor device, the method comprising:
 forming an inactive area in a semiconductor substrate, the inactive area defining a pair of active areas separated by the inactive area;
 forming a via through the semiconductor substrate in the inactive area;
 forming a conduction terminal over the semiconductor substrate that extends across the pair of active areas and the inactive area, the conduction terminal being electrically connected to the via; and
 forming a control terminal over the semiconductor substrate that extends across the pair of active areas and the inactive area to define a conduction region in each active area electrically connected to the conduction terminal.

17. The method of claim 16, further comprising epitaxially growing a Group III-nitride semiconductor layer grown on a base substrate of the semiconductor substrate.

18. The method of claim 16, wherein the semiconductor substrate comprises silicon carbide.

19. The method of claim 16, wherein:
- forming the control terminal comprises forming a plurality of gate fingers over the semiconductor substrate that extend across the pair of active areas and the inactive area; and
- the plurality of gate fingers are configured such that the semiconductor device has a uniform gate pitch.

20. The method of claim 16, wherein:
- forming the control terminal comprises forming a plurality of gate fingers over the semiconductor substrate that extend across the pair of active areas and the inactive area; and
- a pitch of the plurality of gate fingers varies between the pair of active areas and the inactive area.

* * * * *